United States Patent
Yamada et al.

(10) Patent No.: US 11,592,488 B2
(45) Date of Patent: *Feb. 28, 2023

(54) BATTERY MONITORING SYSTEM

(71) Applicant: DENSO CORPORATION, Kariya (JP)

(72) Inventors: Ichiro Yamada, Kariya (JP); Nobuo Yamamoto, Kariya (JP); Shuhei Yoshida, Kariya (JP)

(73) Assignee: DENSO CORPORATION, Kariya (JP)

( * ) Notice: Subject to any disclaimer, the term of this patent is extended or adjusted under 35 U.S.C. 154(b) by 277 days.

This patent is subject to a terminal disclaimer.

(21) Appl. No.: 16/284,442

(22) Filed: Feb. 25, 2019

(65) Prior Publication Data

US 2019/0265303 A1    Aug. 29, 2019

(30) Foreign Application Priority Data

Feb. 28, 2018  (JP) .............................. JP2018-034309
Feb. 21, 2019  (JP) .............................. JP2019-029054

(51) Int. Cl.
*G01R 31/36*  (2020.01)
*H01M 10/48*  (2006.01)

(52) U.S. Cl.
CPC ...... *G01R 31/3648* (2013.01); *H01M 10/486* (2013.01)

(58) Field of Classification Search
CPC .............. G01R 31/3648; G01R 31/367; G01R 31/3835; G01R 31/387; G01R 31/396;
(Continued)

(56) References Cited

U.S. PATENT DOCUMENTS 9,237,459 B1    1/2016  Erell et al.
2004/0251875 A1  12/2004  Kinoshita et al.
(Continued)

FOREIGN PATENT DOCUMENTS

JP    2016-152704 A    8/2016
JP    2017-138241 A    8/2017
(Continued)

OTHER PUBLICATIONS

Wikipedia, Partial correlation, printed Oct. 27, 2021. (Year: 2021).*
(Continued)

*Primary Examiner* — Michael P Nghiem
(74) *Attorney, Agent, or Firm* — Oliff PLC

(57) ABSTRACT

A battery monitoring system includes a data acquiring unit and a failure determining unit. The data acquiring unit acquires a plurality of types of monitoring data to monitor a state of a secondary battery. The failure determining unit determines whether the secondary battery has failed. The failure determining unit performs sparsity regularization using the monitoring data as variables and calculates a partial correlation coefficient matrix of the monitoring data. The failure determining unit calculates, as an abnormality level, an amount of change in a partial correlation coefficient, which is a component of the partial correlation coefficient matrix, between two partial correlation coefficient matrices calculated at different periods. The failure determining unit determines that the secondary battery has failed when the calculated abnormality level exceeds a predetermined threshold.

8 Claims, 12 Drawing Sheets

(58) Field of Classification Search
CPC .............. G01R 31/392; H01M 10/443; H01M 2010/4271
USPC .......................................................... 702/63
See application file for complete search history.

(56) References Cited

U.S. PATENT DOCUMENTS

| | | | |
|---|---|---|---|
| 2015/0048838 A1* | 2/2015 | Ose ...................... | G01R 31/382 324/430 |
| 2015/0149015 A1* | 5/2015 | Nakano ................... | B60L 53/65 701/22 |
| 2016/0169978 A1 | 6/2016 | Fukuhara | |
| 2016/0252586 A1 | 9/2016 | Shimura et al. | |
| 2018/0270132 A1* | 9/2018 | Hashimoto .......... | H04L 43/0823 |
| 2018/0285317 A1* | 10/2018 | Nishida ................... | G06F 30/23 |
| 2018/0348728 A1* | 12/2018 | Ota ................... | G05B 19/41885 |
| 2018/0357539 A1* | 12/2018 | Hwang ..................... | G06N 3/04 |
| 2019/0018397 A1* | 1/2019 | Shiba ............... | G05B 19/41875 |
| 2019/0265309 A1* | 8/2019 | Yamada ............... | G01R 31/382 |
| 2019/0310321 A1* | 10/2019 | Mi ......................... | H02J 7/0014 |
| 2020/0342359 A1* | 10/2020 | Hu .......................... | G06N 20/10 |
| 2020/0380371 A1* | 12/2020 | Ding ....................... | G06N 3/084 |

FOREIGN PATENT DOCUMENTS

| | | |
|---|---|---|
| JP | 2017-139911 A | 8/2017 |
| JP | 2019-152656 A | 9/2019 |

OTHER PUBLICATIONS

Wikipedia, Structured sparsity regularization, printed Oct. 27, 2021. (Year: 2021).*

Apr. 15, 2021 Office Action issued in U.S. Appl. No. 16/284,336.
U.S. Appl. No. 16/284,336, filed Feb. 25, 2019 in the name of Yamada et al. (U.S. Appl. No. 16/284,336, filed Feb. 25, 2019).
Rosasco, "Sparsity Based Regularization," 9.520 Class 11, Mar. 11, 2009. Accessed at https://www.mit.edu/~9.520/spring09/Classes/class11_sparsity.pdf.
Friedman et al., "Sparse inverse covariance estimation with the graphical lasso," Biostatistics (2008), 9, 3, pp. 432-441. Accessed at https://doi.org/10.1093/biostatistics/kxm045.
Williams et al., Back to the Basics: Rethinking Partial Correlation Network Methodology, PsyArXiv, Apr. 7, 2018, pp. 1-15.
Lafit et al., "A Partial Correlation Screening Approach for Controlling the False Positive Rate in Sparse Gaussian Graphical Models," Scientific Reports (2019), 9:17759, pp. 1-24. Accessed at https://www.nature.com/articles/s41598-019-53795-x.
Ide et al., "Proximity-Bases Anomoly Detection Using Sparse Structure Learning," Tokyo Research Laboratory, 2009,04, pp. 1-16. Accessed at https://ide-research.net/papers/2009_SDM_a_Ide.ppt.
Apr. 28, 2022 Office Action issued in U.S. Appl. No. 16/284,336.
Kawano, S; "Regression modeling base on sparse regularization and its computational algorithms (Statistics One Point);" Japanese Society of Computational Statics; 33(2), 2017, pp. 173-186.
Ide, T; "A story of graphical lasso that adds sparsity to the dependency;" Iwanami Data Science; vol. 5; pp. 48-63; 2016.
Kawano, S. et al; "Statistical modeling with sparse estimation method;" Kyoritsu Shuppan Co., LTD.; pp. 4-6, 20-21, 105-115; Mar. 15, 2018.
Ide et al; "Proximity-based anomaly detection using sparse structure learning;" Proceedings of 2009 SIAM International Conference on Data Mining (SDM 09, Apr. 30-May 2, Sparks, USA); pp. 97-108.

* cited by examiner

BATTERY MONITORING SYSTEM

CROSS-REFERENCE TO RELATED APPLICATION

This application is based on and claims the benefit of priority from Japanese Patent Application No. 2018-034309, filed Feb. 28, 2018 and Japanese Patent Application No. 2019-029054, filed Feb. 21, 2019. The entire disclosures of the above applications are incorporated herein by reference.

BACKGROUND

Technical Field

The present disclosure relates to a battery monitoring system.

Related Art

A battery monitoring system has been known, in which fault diagnosis of a secondary battery is performed using an open circuit voltage (OCV) and a state of charge (SOC) of the secondary battery. As another example, there is a method for performing fault diagnosis using capacity of the secondary battery.

SUMMARY

An exemplary embodiment of the present disclosure provides a battery monitoring system that acquires a plurality of types of monitoring data to monitor a state of a secondary battery and determines whether the secondary battery has failed. The battery monitoring system performs sparsity regularization using the monitoring data as variables and calculates a partial correlation coefficient matrix of the monitoring data. The battery monitoring system calculates, as an abnormality level, an amount of change in a partial correlation coefficient, which is a component of the partial correlation coefficient matrix, between two partial correlation coefficient matrices calculated at different periods. The battery monitoring system determines that the secondary battery has failed when the calculated abnormality level exceeds a predetermined threshold.

DESCRIPTION OF THE EMBODIMENTS

Figure 1:
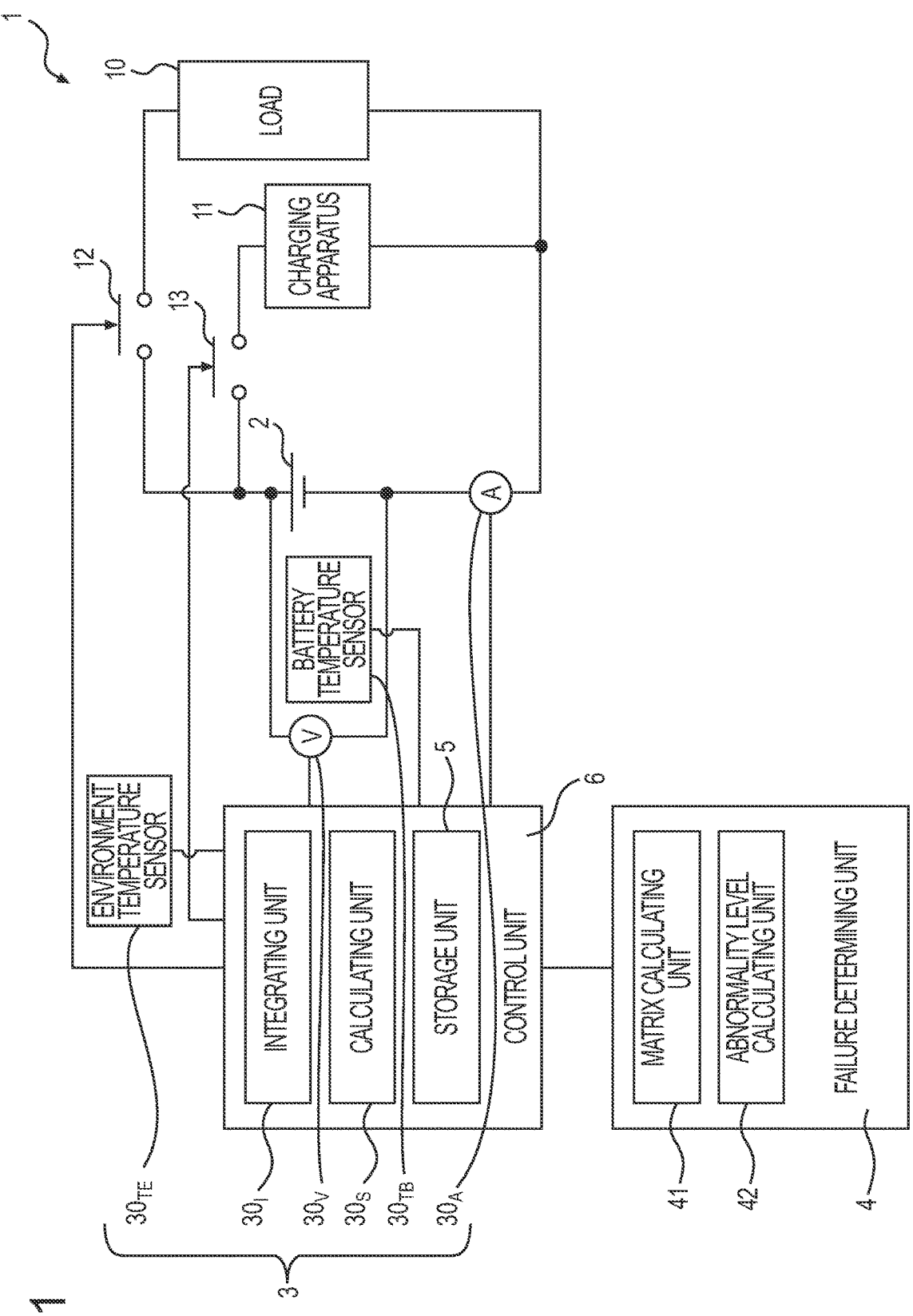
FIG. 1 is a circuit diagram of a battery monitoring system according to a first embodiment.

The following embodiments relate to a battery monitoring system that performs fault diagnosis of a secondary battery.

A battery monitoring system that performs fault diagnosis of a secondary battery has been known. For example, in this battery monitoring system, an open circuit voltage (OCV) and a state of charge (SOC) of the secondary battery are periodically measured. The measured values of the OCV and the SOC are then cumulatively stored. When a relationship between the OCV and the SOC that have been newly measured has significantly changed compared to a relationship between the OCV and the SOC that have been previously measured, the secondary battery is determined to have failed.

In addition, as another example of fault diagnosis, there is a method in which the capacity of the secondary battery is measured. In this case, first, the secondary battery is fully discharged. Subsequently, the secondary battery is fully charged. Then, the capacity of the secondary battery is measured through measurement of the charge amount required for charging. When the value of the capacity that has been newly measured has significantly changed compared to the value of the capacity that has been previously measured, the secondary battery is determined to have failed.

However, in the method in which the OCV and the SOC are measured, and fault diagnosis is performed based on whether the relationship between the OCV and the SOC has changed compared to the relationship between previous measured values, the measured values of the OCV and the SOC are required to be cumulatively stored. As a result, the amount of data that is stored becomes large and a large-volume storage apparatus is required. Furthermore, failure determination is difficult to perform until the secondary battery has completely failed. That is, initial state of failure of the battery is difficult to detect.

Moreover, when fault diagnosis is performed through measurement of the capacity of the secondary battery, an issue in that a large amount of time is required for measurement of the capacity arises.

It is thus desired to provide a battery monitoring system that is capable of detecting initial state of failure of a secondary battery, reducing an amount of data to be stored, and performing failure determination in a small amount of time.

An exemplary embodiment provides a battery monitoring system that includes a data acquiring unit and a failure determining unit. The data acquiring unit acquires a plurality of types of monitoring data that are used to monitor a state of a secondary battery. The failure determining unit determines whether the secondary battery has failed. The failure determining unit includes a matrix calculating unit and an abnormality level calculating unit. The matrix calculating unit performs sparsity regularization using the monitoring data as variables and calculates a partial correlation coefficient matrix of the monitoring data. The abnormality level calculating unit calculates, as an abnormality level, an amount of change in a partial correlation coefficient, which is a component of the partial correlation coefficient matrix, between two partial correlation coefficient matrices calculated at different periods. The failure determining unit is configured to determine that the secondary battery has failed when the calculated abnormality level exceeds a predetermined threshold.

The failure determining unit of the above-described battery monitoring system performs sparsity regularization using the monitoring data of the secondary battery as variables and calculates the partial correlation coefficient matrix. Then, the failure determining unit calculates, as the abnormality level, the amount of change in the partial correlation coefficient between two partial correlation coefficient matrices acquired at different periods. The failure determining unit determines that the secondary battery has failed when the abnormality level exceeds the threshold.

As a result, initial state of failure of the secondary battery can be detected. That is, when sparsity regularization is performed, two types of monitoring data that have a high correlation can be selected among the plurality of types of monitoring data of the secondary battery. That is, when two types of monitoring data have a high correlation, the absolute value of the partial correlation coefficient becomes closer to 1. In addition, when two types of monitoring data have a low correlation, the absolute value of the partial correlation coefficient becomes closer to 0.

Therefore, when two partial correlation coefficient matrices are calculated with a period of time therebetween, and the partial correlation coefficients included in the matrices have significantly changed, this indicates that the correlation between the two types of monitoring data that have a high correlation has deteriorated. Therefore, in this case, a determination that a failure of some sort has occurred in the secondary battery can be made. In particular, the partial correlation coefficient significantly changes even when an initial state of failure occurs in the secondary battery. Therefore, initial state of failure of the secondary battery can be detected through use of the change in the partial correlation coefficient.

In addition, the battery monitoring system according to the present embodiment is capable of performing failure detection without being required to store all pieces of monitoring data acquired in the past, as long as the calculated partial correlation coefficient matrices are stored. Furthermore, the battery monitoring system is not required to store all previous partial correlation coefficient matrices but, rather, is merely required to store the partial correlation coefficient matrix that has been most recently determined. Therefore, the amount of data to be stored can be reduced. Moreover, compared to cases where the capacity of the secondary battery is measured, the above-described battery monitoring system can perform failure determination of the secondary battery in a small amount of time.

As described above, according to the above-described exemplary embodiment, a battery monitoring system that is capable of detecting initial state of failure of a secondary battery, reducing an amount of data to be stored, and performing failure determination in a small amount of time can be provided.

First Embodiment

A first embodiment of the above-described battery monitoring system will be described with reference to FIG. 1 to FIG. 11. As shown in FIG. 1, a battery monitoring system 1 according to the present embodiment includes a data acquiring unit 3 and a failure determining unit 4. The data acquiring unit 3 acquires a plurality of types of monitoring data $X_1$ to $X_n$ (see FIG. 2) that are used to monitor the state of a secondary battery 2. The failure determining unit 4 determines whether the secondary battery 2 has failed.

The failure determining unit 4 includes a matrix calculating unit 41 and an abnormality level calculating unit 42. The matrix calculating unit 41 performs sparsity regularization using the above-described pieces of monitoring data as variables. The matrix calculating unit 41 thereby calculates a partial correlation coefficient matrix Λ of the monitoring data (see FIG. 10 and FIG. 11). In addition, the abnormality level calculating unit 42 calculates, as an abnormality level Δ, an amount of change in a partial correlation coefficient λ between two partial correlation matrices Δ that have been acquired at different periods. When the calculated abnormality level Δ exceeds a predetermined threshold $\Delta_{TH}$, the failure determining unit 4 determines that the secondary battery 2 has failed.

The battery monitoring system 1 according to the present embodiment is an onboard battery monitoring system that is mounted in a vehicle, such as an electric vehicle or a hybrid vehicle. As shown in FIG. 1, a load 10 and a charging apparatus 11 are connected to the secondary battery 2. The load 10 according to the present embodiment is an inverter. Direct-current power provided by the secondary battery 2 is converted to alternating-current power through use of the inverter, and a three-phase alternating current motor (not shown) is thereby driven. As a result, the vehicle is made to drive.

A discharge switch 12 is arranged between the load 10 and the secondary battery 2. In addition, a charging switch 13 is arranged between the charging apparatus 11 and the secondary battery 2. A control unit 6 controls on/off operations of the switches 12 and 13. When the secondary battery 2 is charged, the control unit 6 turns on the charging switch 13. When the load 10 is driven, the control unit 6 turns on the discharge switch 12.

The data acquiring unit 3 according to the present embodiment acquires a closed circuit voltage (CCV), a charge/discharge current I, an SOC, an environmental temperature $T_E$ of the periphery of the secondary battery 2, a battery temperature $T_B$, an integrated temperature stress $\Sigma T$, an integrated charging time $\Sigma t_c$, an integrated discharge time $\Sigma t_d$, and an integrated current $\Sigma I$.

The data acquiring unit 3 includes a current sensor $30_A$, a voltage sensor $30_V$, a battery temperature sensor $30T_B$, an environment temperature sensor $30T_E$, an integrating unit $30_U$, and a SOC calculating unit $30_S$. The current sensor $30_A$ measures the charge/discharge current I. The battery temperature sensor $30T_B$ measures the battery temperature $T_B$. The environment temperature sensor $30T_E$ measures the environmental temperature $T_E$. The voltage sensor $30_V$ measures the CCV and the OCV of the secondary battery 2. The SOC calculating unit $30_S$ calculates the SOC of the secondary battery 2 using the measured value of the OCV.

In addition, the integrating unit $30_I$ calculates the integrated temperature stress $\Sigma T$, the integrated charging time $\Sigma t_c$, the integrated discharge time $\Sigma t_d$, and the integrated current $\Sigma I$. The integrated charging time $\Sigma t_c$ is an integration value of a charging time $t_c$ of the secondary battery 2. The integrated discharge time $\Sigma t_d$ is an integration value of a discharge time $t_d$ of the secondary battery 2. The integrated current $\Sigma I$ is an integration value of the charge/discharge current I. Furthermore, the integrated temperature stress $\Sigma T$ is an integration value of an amount of time at each temperature during use. For example, the integrated temperature stress $\Sigma T$ can be calculated in the following manner: $\{10°\text{ C.}\times\text{time}\}+\{15°\text{ C.}\times\text{time}\}+\ldots+\{45°\text{ C.}\times\text{time}\}$. In addition, because a greater amount of stress is applied to the secondary battery 2 as the temperature increases, weight may be applied to the amounts of time. The method for calculating the integrated temperature stress $\Sigma T$ is not limited thereto. For example, a method in which only the amounts of time at which the temperature is 40° C. or higher are counted and integrated can also be used.

In addition, the battery monitoring system 1 according to the present embodiment includes a storage unit 5. The storage unit 5 stores therein the pieces of monitoring data required for calculation of the above-described partial correlation coefficient matrices $\Lambda$ and the calculated partial correlation coefficient matrices $\Lambda$.

Figure 8:
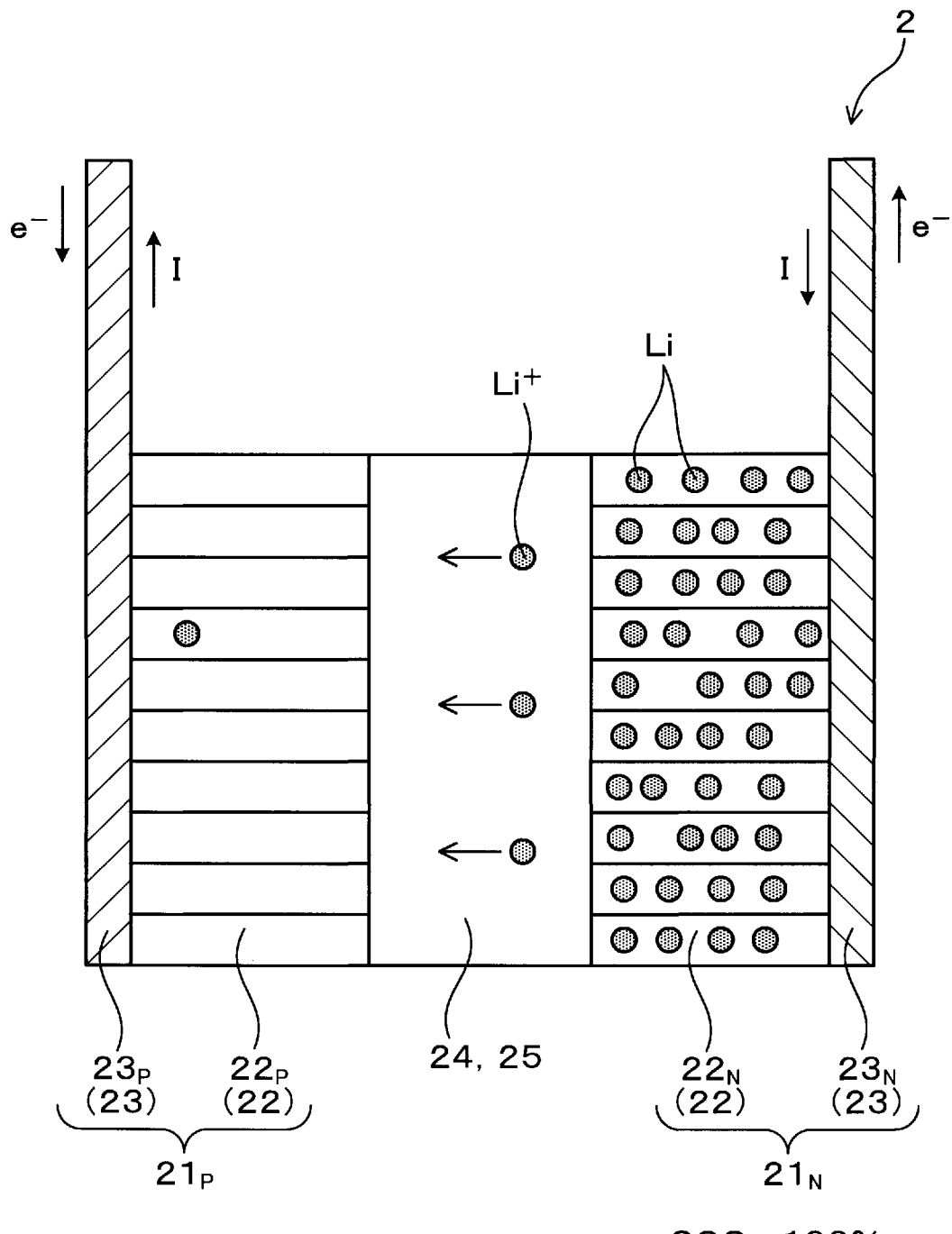
FIG. 8 is a conceptual diagram of a secondary battery during discharge according to the first embodiment.

Next, a structure of the secondary battery 2 will be described. As shown in FIG. 8, the secondary battery 2 includes a positive electrode $21_P$, a negative electrode $21_N$, a separator 24, and an electrolyte 25. The separator 24 is disposed between the positive electrode $21_P$ and the negative electrode $21_N$. The positive electrode $21_P$ and the negative electrode $21_N$ each include a current collector 23 ($23_P$ and $23_N$) and an active material 22 ($22_P$ and $22_N$) that is attached to the current collector 23. The secondary battery 2 according to the present embodiment is a lithium-ion secondary battery.

Figure 9:
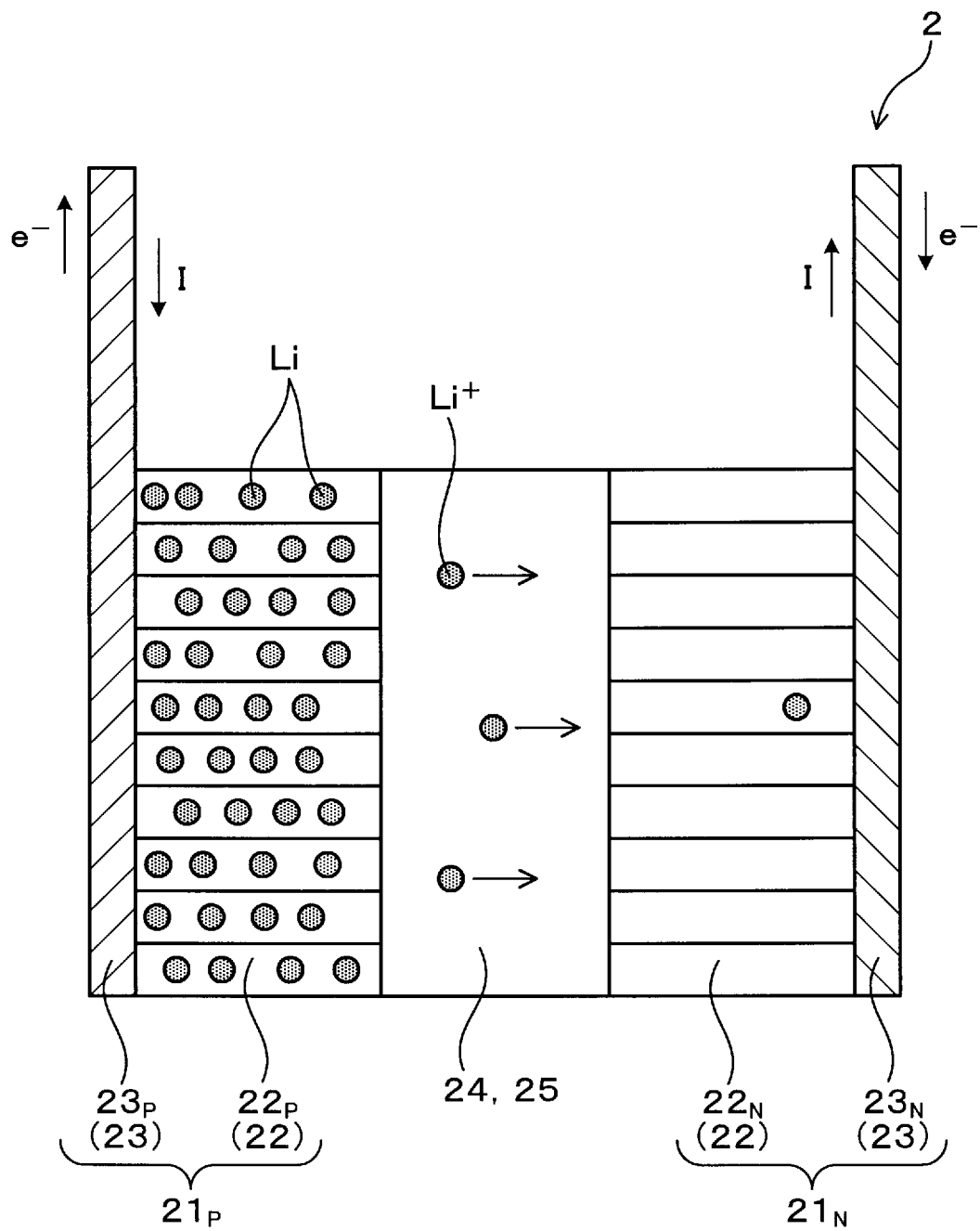
FIG. 9 is a conceptual diagram of the secondary battery during charging according to the first embodiment.

As shown in FIG. 8, when the SOC of the secondary battery 2 is substantially 100%, most of the lithium ions are present in the active material $22_N$ of the negative electrode $21_N$. When discharge is performed, the lithium ions move to the active material $22_P$ of the positive electrode $21_P$. In addition, as shown in FIG. 9, when the SOC of the secondary battery 2 is substantially 0%, most of the lithium ions are present in the active material $22_P$ of the positive electrode $21_P$. When charging is performed, the lithium ions move to the active material $22_N$ of the negative electrode $21_N$.

When an external impact or the like is applied to the secondary battery 2, failure may occur in the secondary battery 2. For example, the respective current collectors 23 ($23_P$ and $23_N$) of the electrodes 21 ($21_P$ and $21_N$) may come into contact with each other. Alternatively, the active material 22 may separate from the current collector 23. Furthermore, when the secondary battery 2 is used for a long period of time, deposition of metallic lithium into the electrolyte 25 may occur and short-circuiting between the pair of electrodes 21 may occur. The failure determining unit 4 according to the present embodiment determines whether such failures have occurred in the secondary battery 2.

Figure 2:
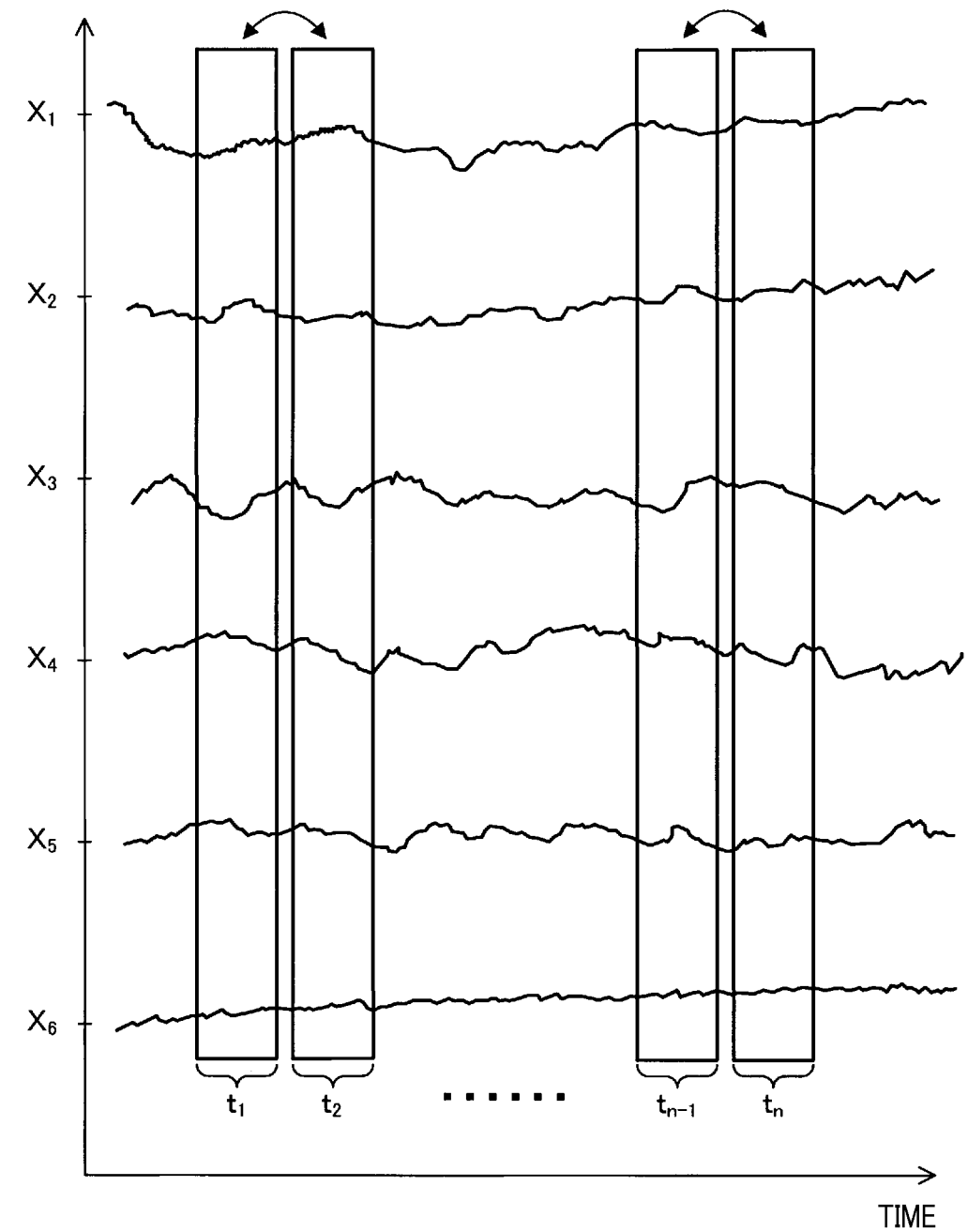
FIG. 2 is a graph of changes with time in monitoring data according to the first embodiment.

Next, a method for performing the fault diagnosis of the secondary battery 2 will be described. Here, as shown in FIG. 2, a case in which six types of monitoring data $X_1$ to $X_6$ are used will be described. For example, the first monitoring data $X_1$ is the CCV. The second monitoring data $X_2$ is the charge/discharge current I. Third monitoring data $X_3$ is the SOC. Fourth monitoring data $X_4$ is the environmental temperature $T_E$. Fifth monitoring data $X_5$ is the battery temperature $T_B$. Sixth monitoring data $X_6$ is the integrated charging time $\Sigma t_c$. Other types of monitoring data X may also be used. The order of the types of monitoring data X is arbitrary. Furthermore, although six types of monitoring data $X_1$ to $X_6$ are used in FIG. 2 and the like, the present disclosure is not limited thereto. Two or more types of monitoring data X may be used.

As shown in FIG. 2, each of the monitoring data X1 to X6 changes with the passage of time. First, the failure determining unit 4 performs sparsity regularization using the monitoring data X1 to X6 acquired during a first period t1 as the variables. The failure determining unit 4 thereby calculates a first partial correlation coefficient matrix $\Lambda_1$. For example, the first partial coefficient matrix $\Lambda_1$ can be expressed in the following manner.

[Formula 1]

$$\Lambda_1 = \begin{bmatrix} & \lambda_{12} & \lambda_{13} & \lambda_{14} & \lambda_{15} & \lambda_{16} \\ & & \lambda_{23} & \lambda_{24} & \lambda_{25} & \lambda_{26} \\ & & & \lambda_{34} & \lambda_{35} & \lambda_{36} \\ & & & & \lambda_{45} & \lambda_{46} \\ & & & & & \lambda_{56} \\ & & & & & \end{bmatrix}$$

In the expression above, $\lambda_{12}$ denotes a partial correlation coefficient between the monitoring data $X_1$ and the monitoring data $X_2$. In addition, because the partial correlation coefficient matrix $\Lambda$ is a symmetric matrix, some of the partial correlation coefficients $\lambda$ are omitted in the expression above. Furthermore, because the components on a main diagonal in the partial correlation coefficient matrix $\Lambda$ are all 1, these components are omitted in the description.

Figure 3:
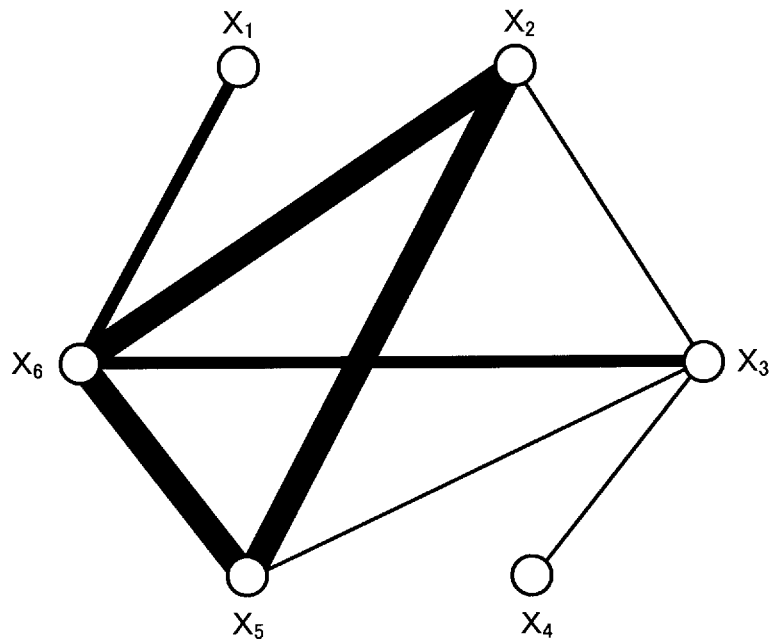
FIG. 3 is a visualization of a partial correlation coefficient matrix $\Lambda_1$ according to the first embodiment.

When the correlation between two types of monitoring data is high, the partial correlation coefficient $\lambda$ becomes closer to 1 or −1. In addition, when the correlation is low, the partial correlation coefficient $\lambda$ becomes closer to 0. FIG. 3 shows a visualization of the first partial correlation coefficient matrix $\Lambda_1$. As shown in FIG. 3, two types of monitoring data X that have a high correlation (such as $X_2$ and $X_6$, and $X_5$ and $X_6$) are indicated by a relatively thick line. In addition, two types of monitoring data X that have a lower correlation (such as $X_3$ and $X_6$) are indicated by slightly thinner lines.

Next, the failure determining unit 4 performs sparsity regularization again using the monitoring data X1 to X6 acquired at a second period t2 (see FIG. 1) as the variables. The failure diagnosing unit 5 thereby calculates a second partial correlation coefficient matrix $\Lambda_2$. For example, the second partial coefficient matrix $\Lambda_2$ can be expressed in the following manner.

[Formula 2]

$$\Lambda_2 = \begin{bmatrix} & \lambda'_{12} & \lambda'_{13} & \lambda'_{14} & \lambda'_{15} & \lambda'_{16} \\ & & \lambda'_{23} & \lambda'_{24} & \lambda'_{25} & \lambda'_{26} \\ & & & \lambda'_{34} & \lambda'_{35} & \lambda'_{36} \\ & & & & \lambda'_{45} & \lambda'_{46} \\ & & & & & \lambda'_{56} \\ & & & & & \end{bmatrix}$$

Figure 4:
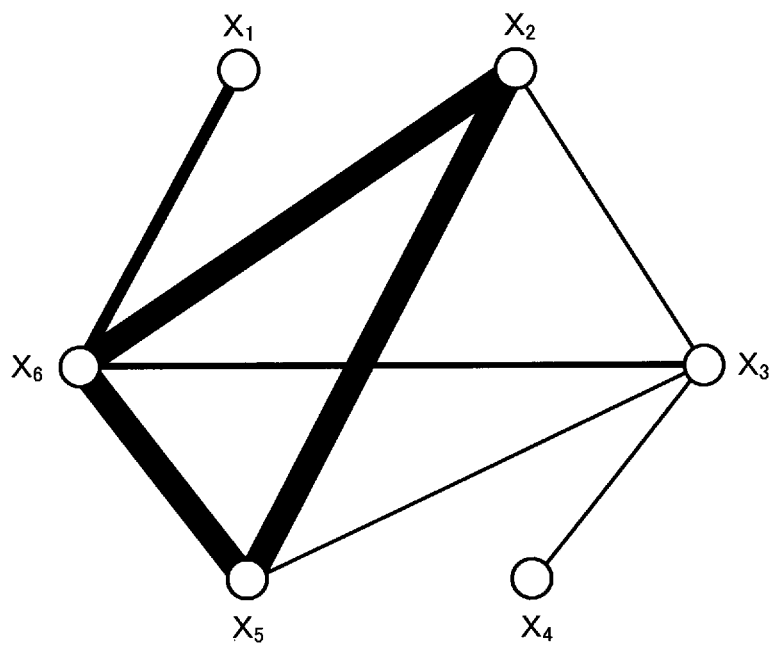
FIG. 4 is a visualization of a partial correlation coefficient matrix $\Lambda_2$ according to the first embodiment.

FIG. 4 shows a visualization of the second partial correlation coefficient matrix $\Lambda_2$. When the correlations between the monitoring data X1 to X6 have not significantly changed, the two partial correlation coefficient matrices $\Lambda 1$ and $\Lambda 2$ are substantially identical. Therefore, graphs (see FIG. 3 and FIG. 4) respectively visualizing the two partial correlation coefficient matrices $\Lambda 1$ and $\Lambda 2$ are substantially identical.

After calculating the two partial correlation coefficient matrices $\Lambda 1$ and $\Lambda 2$ in such a manner, the failure determining unit 4 calculates the amount of change in the partial correlation coefficient $\lambda$ between the two partial correlation coefficient matrices $\Lambda 1$ and $\Lambda 2$ as the abnormality level $\Delta$. For example, the abnormality level $\Delta$ can be expressed in the following manner.

$$\Delta_{12} = |\lambda'_{12} - \lambda_{12}|$$
$$\Delta_{13} = |\lambda'_{13} - \lambda_{13}|$$
$$\vdots$$
$$\Delta_{56} = |\lambda'_{56} - \lambda_{56}|$$

[Formula 3]

Here, $\Delta_{12}$ denotes an abnormality level of the partial correlation coefficient $\lambda_{12}$ between the first monitoring data $X_1$ and the second monitoring data $X_2$.

Figure 6:
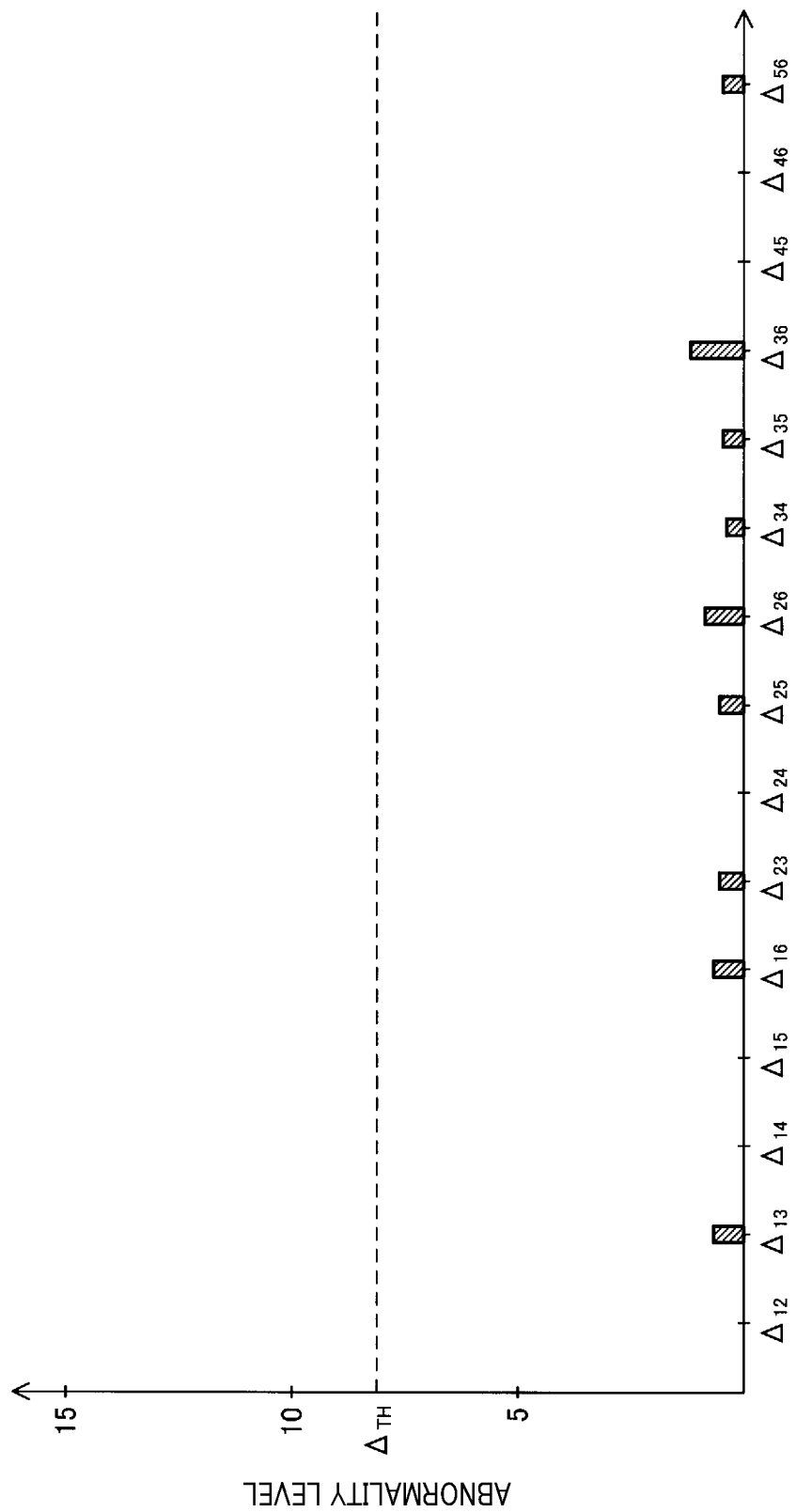
FIG. 6 is a graph of abnormality levels determined from the two partial correlation coefficient matrices $\Lambda_1$ and $\Lambda_2$ according to the first embodiment.

FIG. 6 shows a graph of each of the abnormality levels $\Delta$. As described above, from period t1 to period t2 during which the correlations between the monitoring data $X_1$ to $X_6$ have not significantly changed, the two calculated partial correlation coefficient matrices $\Lambda_1$ and $\Lambda_2$ are substantially identical. Therefore, the amount of change in the partial correlation coefficient $\lambda$ is small, and the abnormality level $\Delta$ is a small value. When all of the abnormality levels $\Delta$ are less than the threshold $\Delta_{TH}$, a determination that the correlations between the monitoring data $X_1$ to $X_6$ have not changed, that is, the secondary battery 2 has not failed is made.

Figure 5:
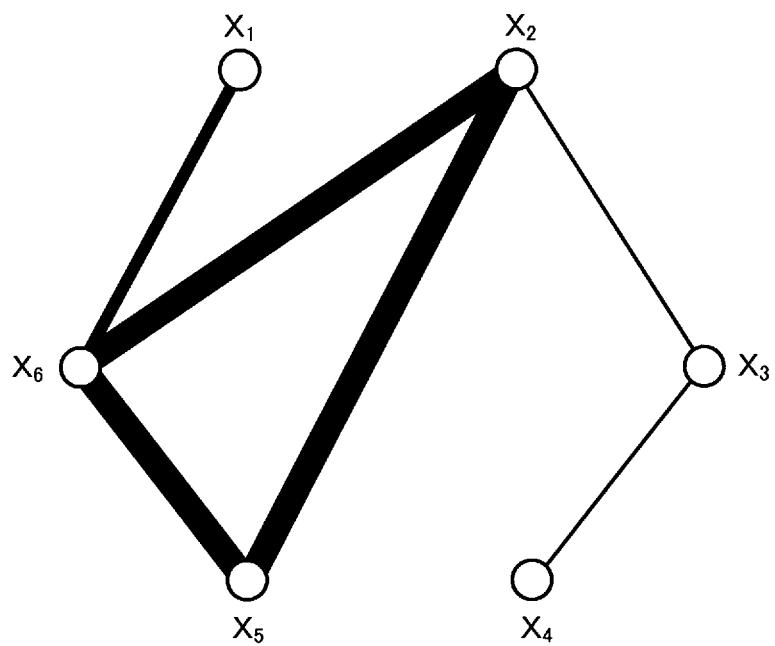
FIG. 5 is a visualization of a partial correlation coefficient matrix $\Lambda_n$ according to the first embodiment.

Next, FIG. 5 shows a graph that is a visualization of the partial correlation coefficient matrix $\Delta$ when the secondary battery 2 has failed. In this graph, compared to those in FIG. 3 and FIG. 4, the correlation between the monitoring data $X_3$ and the monitoring data $X_5$ and the correlation between the monitoring data $X_3$ and the monitoring data $X_6$ are low at substantially 0.

Figure 7:
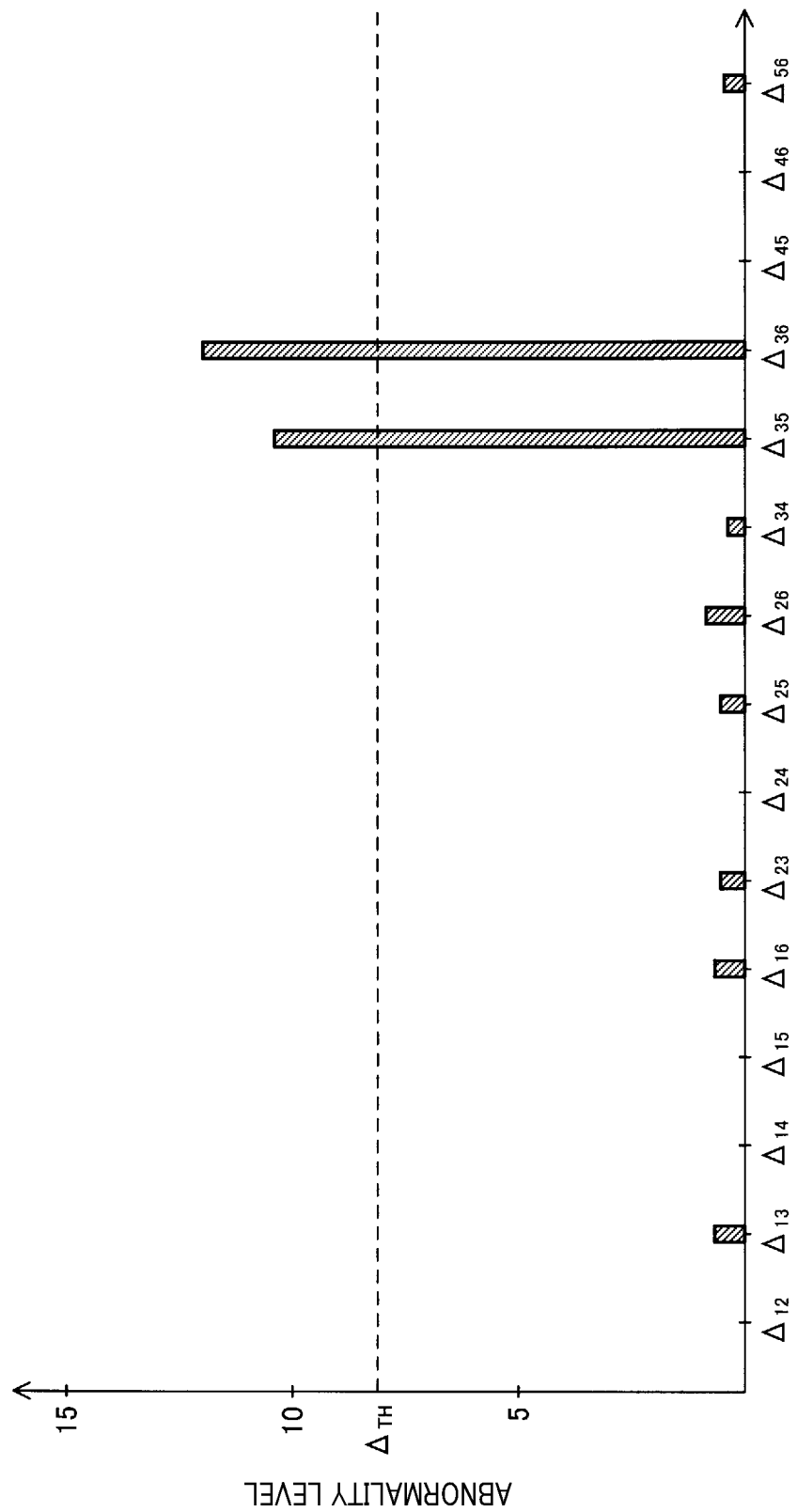
FIG. 7 is a graph of abnormality levels determined from two partial correlation coefficient matrices $\Lambda_{n-1}$ and $\Lambda_n$ according to the first embodiment.

FIG. 7 shows a graph of the abnormality levels $\Delta$ at this time. As shown in FIG. 7, the abnormality level $\Delta_{35}$ of the monitoring data $X_3$ and the monitoring data $X_5$, and the abnormality level $\Delta_{36}$ of the monitoring data $X_3$ and the monitoring data $X_6$ are high. When the calculated abnormality level $\Delta$ exceeds the threshold $\Delta_{TH}$, the failure determining unit 4 determines that the correlations between the monitoring data $X_1$ to $X_6$ have significantly changed, that is, the secondary battery 2 has failed. More specifically, the failure determining unit 4 determines that the secondary battery 2 has failed when at least one abnormality level $\Delta$ among the plurality of calculated abnormality levels $\Delta_{12}$ to $\Delta_{56}$ exceeds the threshold $\Delta_{TH}$.

The failure determining unit 4 according to the present embodiment periodically calculates the partial correlation coefficient matrix $\Lambda$ (such as once a day). The failure determining unit 4 then calculates the abnormality levels $\Delta$ using a partial correlation coefficient matrix $\Lambda_n$ that has been most recently calculated and a partial correlation coefficient matrix $\Lambda_{n-1}$ that has been calculated immediately before the partial correlation coefficient matrix $\Lambda_n$. When at least one abnormality level $\Delta$ among the plurality of calculated abnormality levels $\Delta_{12}$ to $\Delta_{56}$ exceeds the threshold $\Delta_{TH}$, the failure determining unit 4 determines that the secondary battery 2 has failed.

Figure 10:
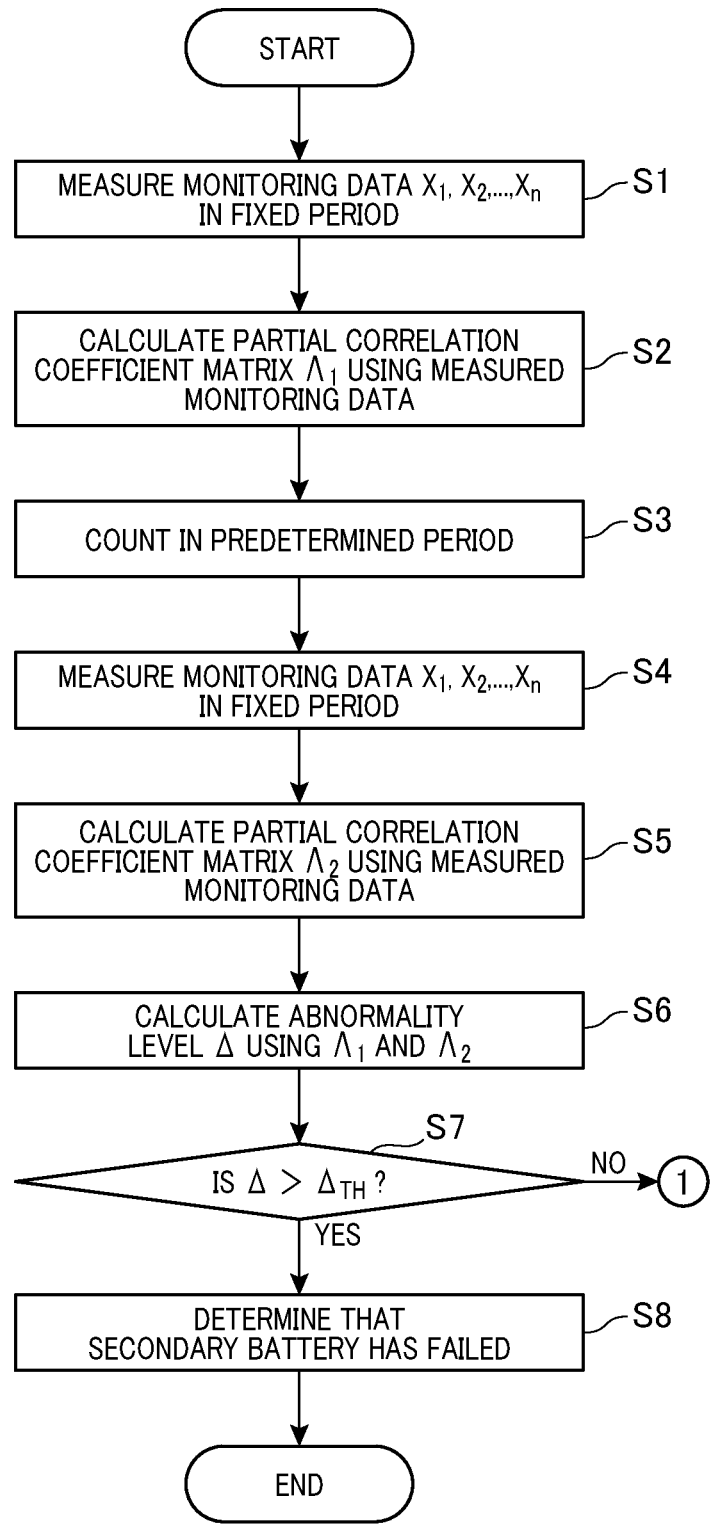
FIG. 10 is a flowchart of processes performed by a control unit according to the first embodiment.
Figure 11:
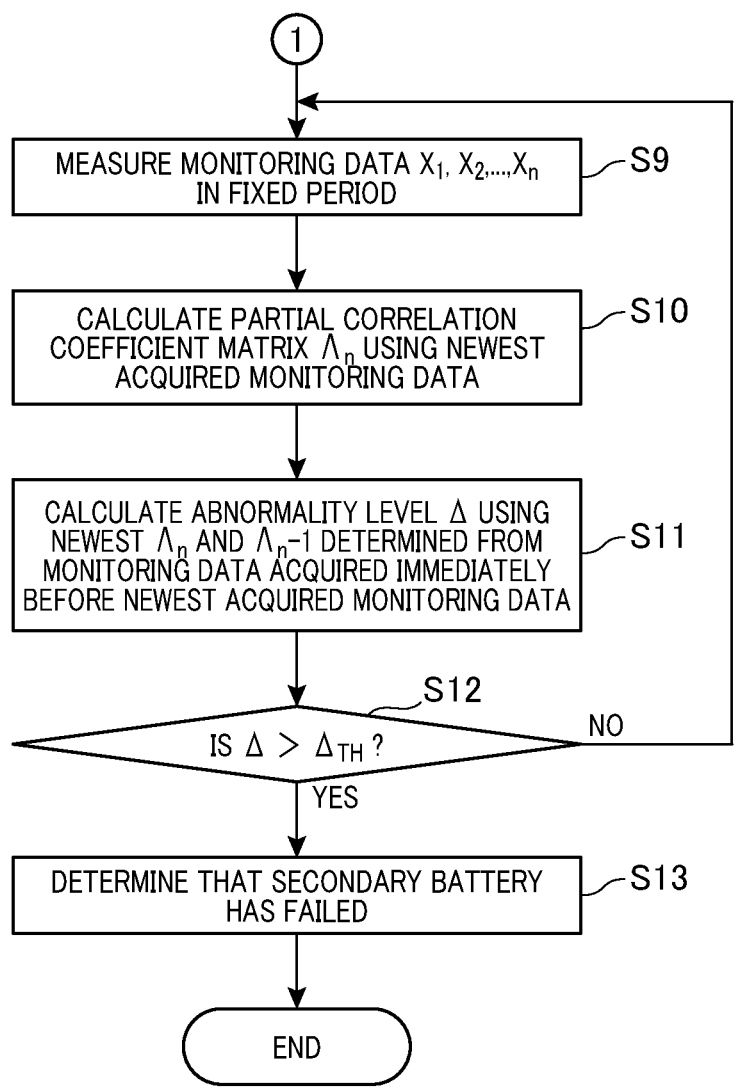
FIG. 11 is a flowchart following the flowchart in FIG. 10.

Next, a flowchart of the processes performed by the failure determining unit 4 will be described. As shown in FIG. 10, first, the failure determining unit 4 according to the present embodiment performs step S1. Here, the failure determining unit 4 acquires the monitoring data $X_1$ to $X_n$ in a fixed period using the data acquiring unit 3. Then, the failure determining unit 4 proceeds to step S2. Here, the failure determining unit 4 calculates the first partial correlation coefficient matrix $\Lambda_1$ using the measured monitoring data $X_1$ to $X_n$.

Subsequently, the failure determining unit 4 proceeds to step S3 and counts in a predetermined period. Next, the failure determining unit 4 proceeds to step S4 and measures the monitoring data $X_1$ to $X_n$ again in a fixed period. Then, the failure determining unit 4 proceeds to step S5. Here, the failure determining unit 4 calculates the second partial correlation coefficient matrix $\Lambda_2$ using the newly measured monitoring data $X_1$ to $X_n$.

Subsequently, the failure determining unit 4 proceeds to step S6. Here, the failure determining unit 4 calculates the abnormality levels $\Delta$ using the two partial correlation coefficient matrices $\Lambda_1$ and $\Lambda_2$. Next, the failure determining unit 4 proceeds to step S7 and determines whether any one of the plurality of abnormality levels $\Delta$ is higher than the threshold $\Delta_{TH}$. When a YES determination is made at step S7 (see FIG. 7), the failure determining unit 4 proceeds to step S8 and determines that the secondary battery 2 has failed.

In addition, when a NO determination is made at step S7, the failure determining unit 4 performs the processes at step S9 and subsequent steps. That is, the failure determining unit 4 periodically acquires the monitoring data $X_1$ to $X_n$ (step S9). The failure determining unit 4 then calculates the abnormality levels $\Delta$ using the partial correlation coefficient matrix $\Lambda_n$ calculated using the newest monitoring data $X_1$ to $X_n$ and the partial correlation coefficient matrix $\Lambda_{n-1}$ that has been calculated immediately the partial correlation coefficient matrix $\Lambda_n$ (step S10 and S11).

The failure determining unit 4 then determines whether the abnormality level $\Delta$ has exceeded the threshold $\Delta_{TH}$ (step S12). When a YES determination is made at step S12 (i.e., when determined that the abnormality level $\Delta$ exceeds the threshold $Å_{TH}$), the failure determining unit 4 determines that the secondary battery 2 has failed (step S13). When a NO determination is made at step S12 (i.e., when determined that the abnormality level $\Delta$ has not exceeded the threshold $\Delta_{TH}$), the failure determining unit 4 returns to step S9.

Next, working effects according to the present embodiment will be described. The failure determining unit 4 according to the present embodiment performs sparsity regularization using the monitoring data $X_1$ to $X_n$ of the secondary battery 2 as variables and calculates the partial correlation coefficient matrix $\Lambda$. Then, the failure determining unit 4 calculates, as the abnormality level $\Delta$, the amount of change in the partial correlation coefficient $\lambda$ between two partial correlation coefficient matrices $\Lambda$ calculated at different periods. When the abnormality level $\Delta$ exceeds the threshold $\Delta_{TH}$, the failure determining unit 4 determines that the secondary battery 2 has failed.

As a result, initial stage of failure of the secondary battery 2 can be detected.

Figure 15:
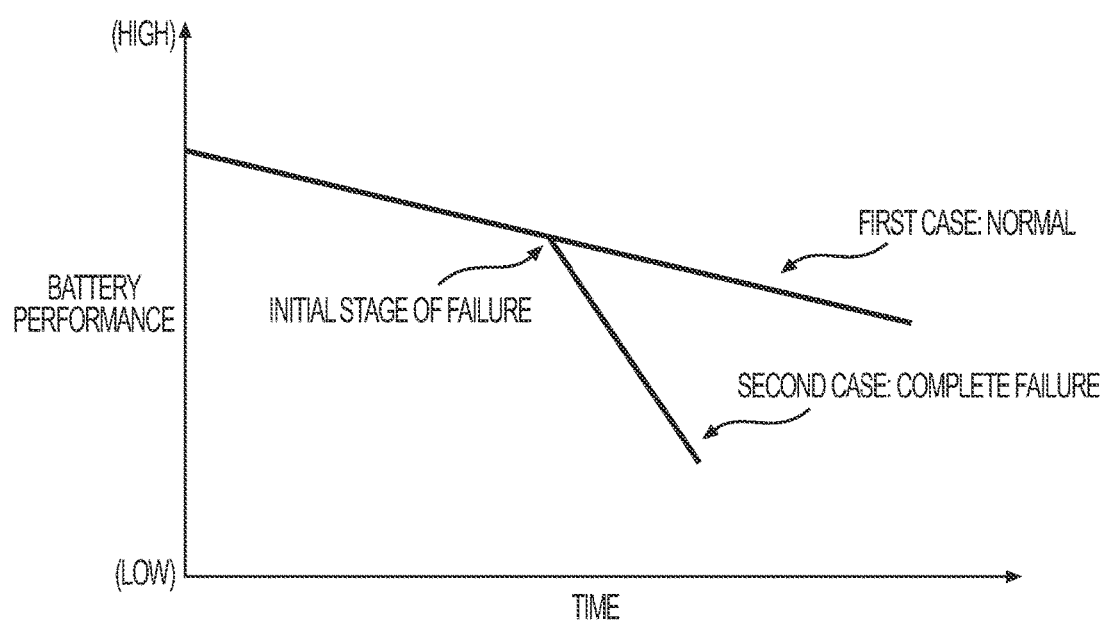
FIG. 15 is a conceptual graph of battery performance of the secondary battery changed with time in a first case where the the secondary battery is normal and in a second case where the secondary battery is failed.

FIG. 15 shows battery performance of the secondary battery changed with time in a first case where the the secondary battery is normal and in a second case where the secondary battery is failed. The battery performance may include a capacity of the the secondary battery or a resistance of the secondary battery.

In the conventional technique, it is difficult to perform failure determination at an initial stage of failure of the secondary battery in the second case, shown in FIG. 15, where the secondary battery is completely failed. Thus, the failure determination cannot be performed at the initial stage of failure of the secondary battery when the battery performance is significantly reduced. In other words, the initial stage of failure of the secondary battery cannot be detected.

In the present embodiment, it is possible to perform failure determination at an initial stage of failure of the secondary battery in the second case, shown in FIG. 15, where the secondary battery is completely failed. Thus, the failure determination can be performed at the initial stage of failure of the secondary battery when the battery performance is significantly reduced. In other words, the initial stage of failure of the secondary battery can be detected.

That is, as described above, when sparsity regularization is performed, two types of monitoring data X that have a high correlation can be selected among the plurality of types of monitoring data $X_1$ to $X_n$ of the secondary battery 2. That is, when two types of monitoring data X have a high correlation, the absolute value of the partial correlation coefficient $\lambda$ becomes closer to 1. In addition, when two types of monitoring data X have a low correlation, the absolute value of the partial correlation coefficient $\lambda$ becomes closer to 0.

Therefore, when two partial correlation coefficient matrices $\Lambda_{n-1}$ and $\Lambda_n$ are calculated with a period of time therebetween, and the partial correlation coefficients $\lambda$ and $\lambda'$ included in the matrices $\Lambda_{n-1}$ and $\Lambda_n$ have significantly changed, this indicates that the correlation between the two types of monitoring data X that have a high correlation has deteriorated. Therefore, in this case, a determination that a failure of some sort has occurred in the secondary battery 2 can be made. In particular, the partial correlation coefficient $\lambda$ significantly changes even when an initial stage of failure occurs in the secondary battery 2. Therefore, initial stage of failure of the secondary battery 2 can be detected through use of the change in the partial correlation coefficient $\lambda$.

In addition, the battery monitoring system 1 according to the present embodiment is capable of performing failure detection without being required to store all pieces of monitoring data X acquired in the past, as long as the calculated partial correlation coefficient matrices $\Lambda$ are stored. Furthermore, the battery monitoring system 1 is not required to store all previous partial correlation coefficient matrices $\Lambda$ but, rather, is merely required to store the partial correlation coefficient matrix $\Lambda$ that has been most recently determined. Therefore, the amount of data to be stored can be reduced. Moreover, compared to cases where the capacity of the secondary battery 2 is measured, the battery monitoring system 1 according to the present embodiment can perform failure determination of the secondary battery 2 in a small amount of time.

In addition, the matrix calculating unit 41 according to the present embodiment periodically calculates the partial correlation coefficient matrix $\lambda$. The abnormality level calculating unit 42 calculates the abnormality level $\Delta$ using the two partial correlation coefficient matrices $\Lambda_{n-1}$ and $\Lambda_n$, that is, the newest calculated partial correlation coefficient matrix $\Lambda_n$ and the partial correlation coefficient matrix $\Lambda_{n-1}$ that has been calculated immediately before the partial correlation coefficient matrix $\Lambda_n$.

As a result, the abnormality level $\Delta$ can be calculated as long as only the partial correlation coefficient matrix $\Lambda_{n-1}$ that has been acquired immediately before the partial correlation coefficient matrix $\Lambda_n$ is stored. Therefore, the partial correlation coefficient matrices $\Lambda$ that have been acquired before the partial correlation coefficient matrix $\Lambda_{n-1}$ are not required to be stored in the storage unit 5 and can be deleted. Consequently, a storage unit 5 that has a small storage capacity can be used, and manufacturing cost of the battery monitoring system 1 can be reduced.

Furthermore, the matrix calculating unit 41 according to the present embodiment is configured to calculate the partial correlation coefficient matrix $\Lambda$ using at least the CCV, the charge/discharge current I, the SOC, and the battery temperature $T_B$ of the secondary battery 2 as the monitoring data $X_1$ to $X_n$.

These types of monitoring data X have a high correlation with one another. Therefore, when these types of monitoring data X are used, the partial correlation coefficient $\lambda$ significantly changes if a failure occurs in the secondary battery 2. Consequently, failure of the secondary battery 2 can be more easily detected.

As described above, according to the present embodiment, a battery monitoring system that is capable of detecting initial stage of failure of a secondary battery, reducing an amount of data to be stored, and performing failure determination in a small amount of time can be provided.

According to the present embodiment, the abnormality level $\Delta$ is calculated through use of the newest partial correlation coefficient matrix $\Lambda_n$ and the partial correlation coefficient matrix $\Lambda_{n-1}$ that has been calculated immediately before the partial correlation coefficient matrix $\Lambda_n$. However, the present disclosure is not limited thereto. That is, the abnormality $\Delta$ may be calculated through use of the newest partial correlation coefficient matrix $\Lambda_n$ and a partial correlation coefficient matrix $\Lambda$ that has been calculated two partial correlation coefficient matrices before the partial correlation coefficient matrix $\Lambda_n$ or more.

For example, when the partial correlation coefficient matrix $\Lambda$ is calculated once a day, the abnormality $\Delta$ can be calculated through use of the newest partial correlation coefficient matrix $\Lambda_n$ and a partial correlation coefficient matrix $\Lambda$ that has been acquired several days ago. As a result, even in cases in which the failure in the secondary battery 2 gradually progresses, the abnormality level $\Delta$ tends to become high because comparison to the partial correlation coefficient matrix $\Lambda$ from several days ago is performed. Consequently, failure of the secondary battery 2 can be reliably detected.

In addition, in FIG. 2 and the like, a 6×6 partial correlation coefficient matrix $\Lambda$ is calculated through use of the six types of monitoring data $X_1$ to $X_6$. The plurality of abnormality levels $\Delta_{12}$ to $\Delta_{56}$ (see FIG. 7) are calculated based on the monitoring data $X_1$ to $X_6$. When at least one abnormality level $\Delta$ among the plurality of abnormality levels $\Delta_{12}$ to $\Delta_{56}$ exceeds the threshold $\Delta_{TH}$, the secondary battery 2 is determined to have failed. However, the present disclosure is not limited thereto. That is, a 2×2 partial correlation coefficient matrix $\Lambda$ may be calculated through use of two types of monitoring data $X_1$ and $X_2$. Only a single abnormality level $\Delta_{12}$ may then be calculated based on the monitoring data $X_1$ and $X_2$.

According to an embodiment below, reference numbers used in the drawings that are the same as those used according to the first embodiment denote constituent elements and the like that are similar to those according to the first embodiment, unless otherwise indicated.

Second Embodiment

Figure 12:
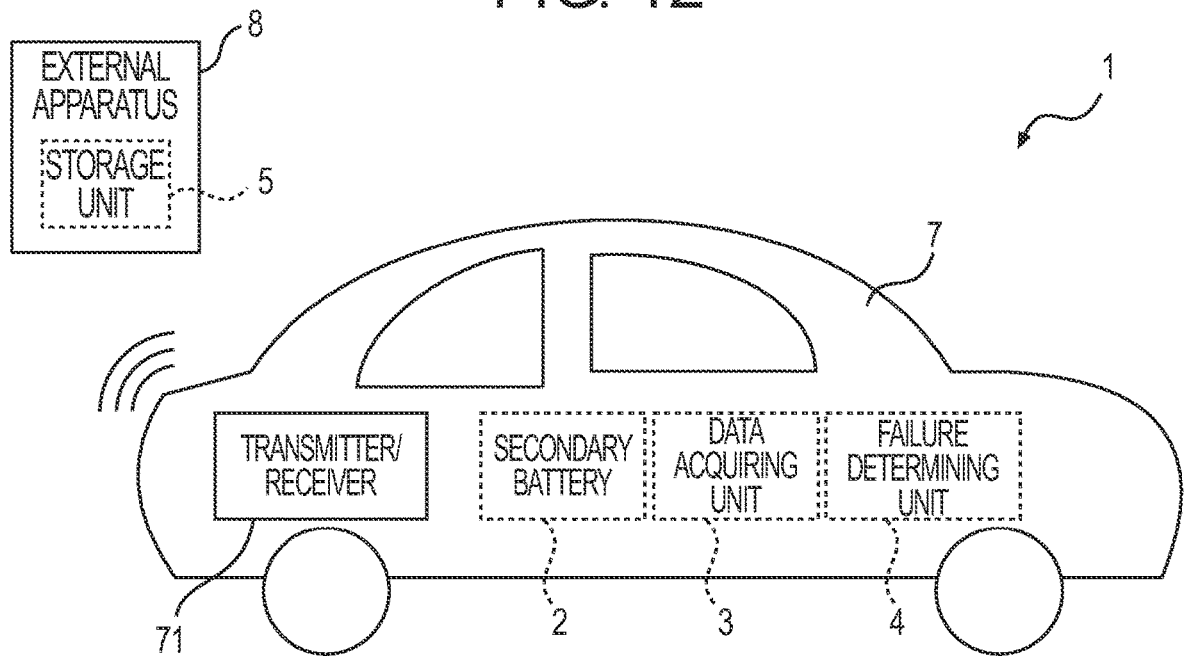
FIG. 12 is a conceptual diagram of a battery monitoring system in which a storage unit is arranged outside a vehicle, according to a second embodiment.

According to a second embodiment, an example in which the configuration of the battery monitoring system 1 is modified is given. According to the present embodiment, at least either of the storage unit 5 and the failure determining unit 4 is arranged outside the vehicle. For example, as shown in FIG. 12, the secondary battery 2, the data acquiring unit 3, and the failure determining unit 4 are arranged inside a vehicle 7. The storage unit 5 is provided as an external apparatus 8 (such as a server). For example, the external apparatus 8 can be set in a car dealership of the vehicle 7. In addition, the vehicle 7 includes a transmitter/receiver 71. The monitoring data X and the partial correlation coefficient matrices Λ are transmitted to the storage unit 5 and received from the storage unit 5 through use of the transmitter/receiver 71.

Figure 13:
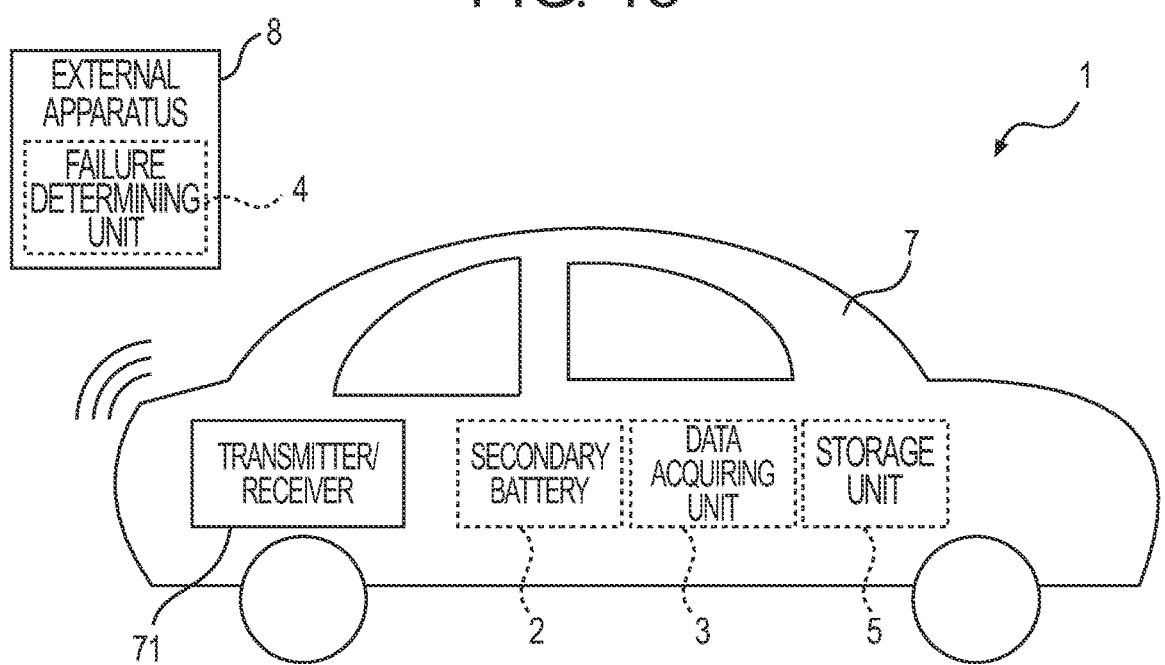
FIG. 13 is a conceptual diagram of a battery monitoring system in which a failure diagnosing unit is arranged outside the vehicle, according to the second embodiment.
Figure 14:
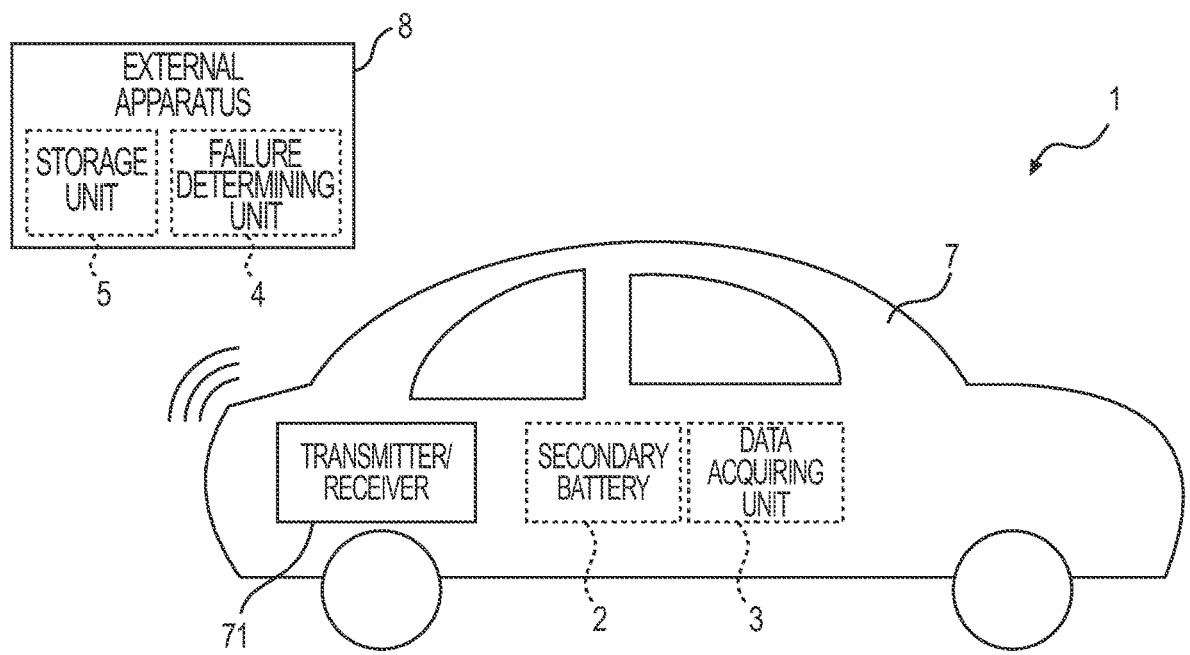
FIG. 14 is a conceptual diagram of a battery monitoring system in which the storage unit and the failure diagnosing unit are arranged outside the vehicle, according to the second embodiment.

In a similar manner, as shown in FIG. 13, the secondary battery 2, the data acquiring unit 3, and the storage unit 5 may be arranged in the vehicle 7, and the failure determining unit 4 may be arranged outside the vehicle 7. Furthermore, as shown in FIG. 14, the failure determining unit 4 and the storage unit 5 may both be arranged outside the vehicle 7.

Working effects according to the present embodiment will be described. As a result of the above-described configuration, because the storage unit 5 and the failure determining unit 4 can be arranged outside the vehicle 7, the number of components mounted in the vehicle 7 can be reduced. Weight reduction of the vehicle 7 can be facilitated. In addition, the failure determining unit 4 can be configured by an apparatus that has a high computation rate, such as a server. Consequently, failure determination can be performed in an even smaller amount of time.

Furthermore, according to the present embodiment, configurations and working effects similar to those according to the first embodiment are also provided.

The present disclosure is not limited to the above-described embodiments. Various embodiments are applicable without departing from the spirit of the present disclosure.

What is claimed is:

1. A battery monitoring system comprising:
   a data acquiring unit including at least one sensor, the data acquiring unit acquiring a plurality of types of monitoring data to monitor a state of a secondary battery; and
   a processor configured to:
   determine whether the secondary battery has failed, wherein
   the processor is further configured to:
      perform sparsity regularization using the monitoring data as variables and thereby calculates a partial correlation coefficient matrix of the monitoring data, and
      calculate, as an abnormality level, an amount of change in a partial correlation coefficient, which is a component of the partial correlation coefficient matrix, between two partial correlation coefficient matrices calculated at different periods,
   determine that the secondary battery has failed when the calculated abnormality level exceeds a predetermined threshold,
   the battery monitoring system further comprises a memory that stores therein the calculated partial correlation coefficient matrix,
   the secondary battery and the data acquiring unit are each mounted in a vehicle, and
   at least either of the memory and the processor is arranged outside the vehicle.

2. The battery monitoring system according to claim 1, wherein:
   the processor is configured to
      periodically calculate the partial correlation coefficient matrix; and
      calculate the abnormality level using two partial correlation coefficient matrices that are configured by a newest calculated partial correlation coefficient matrix and a partial correlation coefficient matrix that has been calculated immediately before the newest calculated partial correlation coefficient matrix.

3. The battery monitoring system according to claim 1, wherein:
   the processor is configured to calculate the partial correlation coefficient matrix using at least a closed circuit voltage, a charge/discharge current, a state of charge, and a battery temperature of the secondary battery as the monitoring data.

4. The battery monitoring system according to claim 1, wherein the processor is configured to calculate, as the abnormality level, the amount of change in the partial correlation coefficient, which is the component of the partial correlation coefficient matrix, between only two partial correlation coefficient matrices calculated at different periods.

5. A battery monitoring system comprising:
   a data acquiring unit including at least one sensor, the data acquiring unit acquiring a plurality of types of monitoring data to monitor a state of a secondary battery;
   a memory operatively coupled to the data acquiring unit, the memory storing only an amount of the acquired plurality of types of monitoring data required to calculate a partial correlation coefficient matrix of the monitoring data; and
   a processor configured to determine whether the secondary battery has failed, wherein
   the processor is configured to:
      acquire the stored monitoring data stored in the memory;
      perform sparsity regularization using the stored monitoring data as variables and thereby calculates the partial correlation coefficient matrix of the stored monitoring data;
      calculate, as an abnormality level, an amount of change in a partial correlation coefficient, which is a component of the partial correlation coefficient matrix; between two partial correlation coefficient matrices calculated at different periods;
      determine that the secondary battery has failed when the calculated abnormality level exceeds a predetermined threshold; and
      calculate the partial correlation coefficient matrix using at least a closed circuit voltage, a charge/discharge current, a state of charge, and a battery temperature of the secondary battery as the monitoring data,
   the secondary battery and the data acquiring unit are each mounted in a vehicle, and
   at least either of the memory and the processor is arranged outside the vehicle.

6. The battery monitoring system according to claim 5, wherein:
   the processor is configured to:
      periodically calculate the partial correlation coefficient matrix; and calculate the abnormality level using two partial correlation coefficient matrices that are configured by a newest calculated partial correlation coefficient matrix and a partial correlation coefficient matrix that has been calculated immediately before the newest calculated partial correlation coefficient matrix.

7. A battery monitoring method comprising:
acquiring, by a data acquiring unit including at least one sensor, a plurality of types of monitoring data to monitor a state of a secondary battery;
performing, by a processor, sparsity regularization using the monitoring data as variables and thereby calculating a partial correlation coefficient matrix of the monitoring data;
calculating, by the processor, as an abnormality level, an amount of change in a partial correlation coefficient, which is a component of the partial correlation coefficient matrix, between two partial correlation coefficient matrices calculated at different periods; and
determining, by the processor that the secondary battery has failed when the calculated abnormality level exceeds a predetermined threshold; and
storing, in a memory, the calculated partial correlation coefficient matrix, wherein:
the secondary battery and the data acquiring unit are each mounted in a vehicle, and
at least either of the memory and the processor is arranged outside the vehicle.

8. A battery monitoring method comprising:
acquiring, by a data acquiring unit including at least one sensor, a plurality of types of monitoring data to monitor a state of a secondary battery;
storing, in a memory operatively coupled to the data acquiring unit, only an amount of the acquired plurality of types of monitoring data required to calculate a partial correlation coefficient matrix of the monitoring data;
performing, by a processor, sparsity regularization using the stored monitoring data as variables and thereby calculating the partial correlation coefficient matrix of the stored monitoring data;
calculating, by the processor, as an abnormality level, an amount of change in a partial correlation coefficient, which is a component of the partial correlation coefficient matrix, between two partial correlation coefficient matrices calculated at different periods;
determining, by the processor, that the secondary battery has failed when the calculated abnormality level exceeds a predetermined threshold; and
calculating, by the processor, the partial correlation coefficient matrix using at least a closed circuit voltage, a charge/discharge current, a state of charge, and a battery temperature of the secondary battery as the monitoring data, wherein
the secondary battery and the data acquiring unit are each mounted in a vehicle, and at least either of the memory and the processor is arranged outside the vehicle.

* * * * *